United States Patent
Xu et al.

(10) Patent No.: US 9,813,009 B1
(45) Date of Patent: Nov. 7, 2017

(54) ACTIVE GATE CLAMPING FOR INVERTER SWITCHING DEVICES USING GROUNDED GATE TERMINALS

(71) Applicant: Ford Global Technologies, LLC, Dearborn, MI (US)

(72) Inventors: Zhuxian Xu, Novi, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/426,288

(22) Filed: Feb. 7, 2017

(51) Int. Cl.
| | |
|---|---|
| H02P 27/04 | (2016.01) |
| H02P 27/08 | (2006.01) |
| B60L 11/18 | (2006.01) |
| H02M 7/5395 | (2006.01) |
| H03K 17/567 | (2006.01) |
| H03K 17/687 | (2006.01) |

(52) U.S. Cl.
CPC .......... H02P 27/08 (2013.01); B60L 11/1803 (2013.01); H02M 7/5395 (2013.01); H03K 17/567 (2013.01); H03K 17/6872 (2013.01)

(58) Field of Classification Search
CPC .... H02P 1/00; H02P 3/00; H02P 27/04; H02P 6/00; H02P 6/14
USPC .............. 318/400.01, 700, 701, 727, 400.26, 318/400.27, 800, 801; 361/98, 436; 307/412; 327/108; 257/79, 272, 479; 363/40, 44, 120
See application file for complete search history.

(56) References Cited

U.S. PATENT DOCUMENTS

| | | | |
|---|---|---|---|
| 6,208,185 | B1 | 3/2001 | John et al. |
| 6,330,170 | B1 * | 12/2001 | Wang .................. H02J 9/062 363/17 |
| 8,085,083 | B2 | 12/2011 | Lhang et al. |
| 8,760,218 | B2 | 6/2014 | Zhu |
| 2007/0296462 | A1 | 12/2007 | Hwang et al. |
| 2010/0328833 | A1 | 12/2010 | Frisch et al. |
| 2013/0300492 | A1 | 11/2013 | Zhao et al. |

OTHER PUBLICATIONS

Infineon, 1ED020I12FA2 Data Sheet, Single 1GBT Driver IC, Apr. 4, 2016.

* cited by examiner

Primary Examiner — Antony M Paul
(74) Attorney, Agent, or Firm — David B. Kelley; MacMillan, Sobanski & Todd, LLC

(57) ABSTRACT

An inverter for an electric vehicle comprises a phase leg having series-connected upper and lower transistors between a positive bus and a ground bus. Upper and lower gate drive circuits supply gate drive signals to the upper and lower transistors. Each gate drive circuit includes an active clamp for deactivating the upper and lower transistors. The transistors are comprised of semiconductor devices, each having respective gate, collector, and emitter terminals. Each pair of gate and emitter terminals is adapted to provide an enhanced common source inductance therebetween. Each gate terminal is adapted to be tied to a ground voltage of the drive circuits. Each respective active clamp is comprised of a p-channel MOSFET having a source terminal connected to the gate terminal of a respective transistor and having a drain terminal connected to the emitter terminal of the respective transistor bypassing the respective enhanced common source inductance.

20 Claims, 3 Drawing Sheets

ACTIVE GATE CLAMPING FOR INVERTER SWITCHING DEVICES USING GROUNDED GATE TERMINALS

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power switching devices in an inverter bridge for an electric vehicle drive system, and, more specifically, to active gate clamping to avoid unintended activations of power switching devices in an inverter.

Electrified vehicles, such as hybrid electric vehicles (HEVs), plug-in hybrid electric vehicles (PHEVs), and battery electric vehicles (BEVs), use inverter-driven electric machines to provide traction torque. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. A typical configuration includes a three-phase motor driven by an inverter with three phase legs. An electronic controller turns the switches on and off to invert a DC voltage from the bus to an AC voltage applied to the motor. The inverter typically pulse-width modulates the DC link voltage to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Because each phase leg of the inverter has a pair of upper and lower switching transistors connected across the DC link, it is important that both devices in a leg not be conducting (i.e., turned-on) simultaneously. A short time interval (known as dead-time) is typically inserted in the PWM switching signals during which both the upper and lower switching devices of a phase leg are turned off in order to prevent "shoot-through" between the positive and ground buses (the ground bus is sometimes referred to as a negative bus, although it is nominally at zero volts). Due to electrical noise and magnetic coupling between the electrical components and signal paths of the gate inputs of the transistors, care must be taken to avoid inadvertent turning on of a transistor when its gate drive signal is intended to be off. Active clamping is sometimes used, wherein a clamp connected across the gate is activated to ensure that the switching transistor stays off.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain to source current) and the gate charging/discharging current. A current in the output (power loop) portion of the common source inductance modifies the gate voltage in a manner that reinforces (e.g., speeds up) the switching performance. For a switching bridge, the reduced switching time may be desirable since it may have an associated reduction in the energy consumed (i.e., lost) during the switching transition, as long as other potential side effects are contained. For example, the presence of a large common source inductance could interfere with the operation of a conventional active clamp circuit.

SUMMARY OF THE INVENTION

In one aspect of the invention, an inverter comprises a phase leg having series-connected upper and lower transistors adapted to be connected between a positive bus and a ground bus. Upper and lower gate drive circuits supply gate drive signals to the upper and lower transistors, respectively. Each gate drive circuit includes an active clamp for deactivating the upper and lower transistors, respectively. The transistors are comprised of semiconductor devices, each having respective gate, collector, and emitter terminals. Each pair of gate and emitter terminals is adapted to provide an enhanced common source inductance therebetween. Each gate terminal is adapted to be tied to a ground voltage of the drive circuits. Each respective active clamp is preferably comprised of a P-channel MOSFET having a source terminal connected to the gate terminal of a respective transistor and having a drain terminal connected to the emitter terminal of the respective transistor bypassing the respective enhanced common source inductance.

DETAILED DESCRIPTION OF PREFERRED EMBODIMENTS

Common source inductance ($L_{CSI}$) is an inductance shared by a main power loop and a gate drive loop for a transistor switching device. The main power loop carries the collector-emitter output current of the device, and the gate loop carries the gate-emitter control current. A common inductance usually arises from parasitic inductances associated with the device packaging and traces on printed circuit boards.

Figure 1:
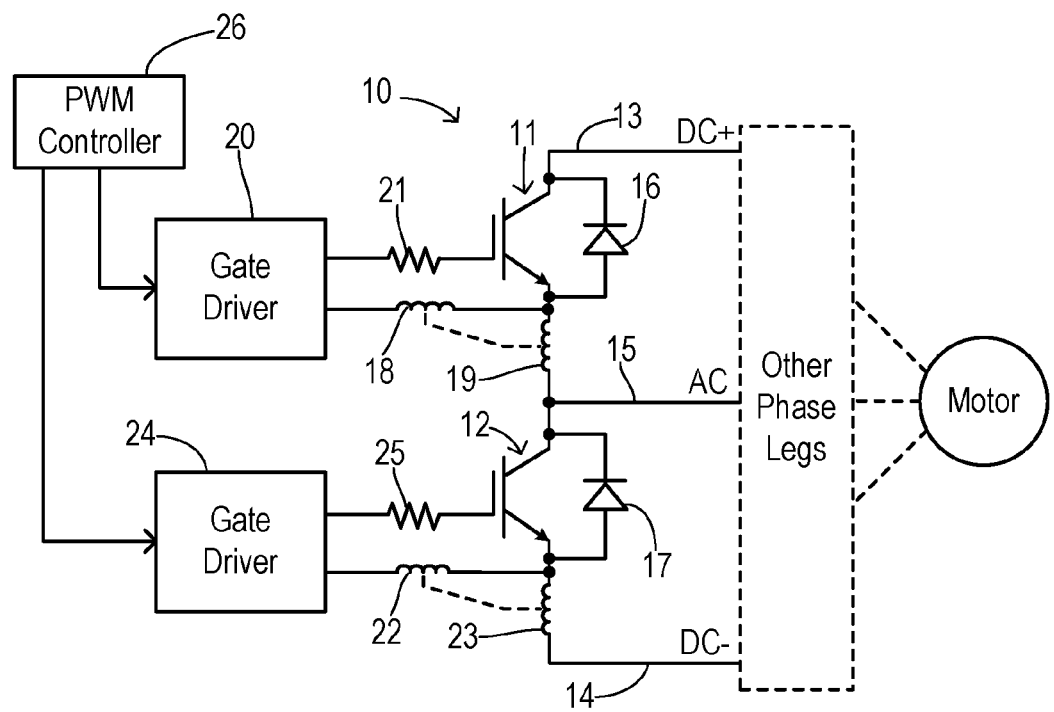
FIG. 1 is a schematic diagram showing an equivalent circuit for a phase leg of an inverter comprising a pair of IGBTs each having an enhanced common source inductance.

FIG. 1 shows an example of a phase leg 10 in an inverter drive system of an electrified vehicle for driving an electric motor, wherein an upper transistor 11 is shown as an IGBT with upper gate, collector, and emitter terminals. Other types of semiconductor devices could be used, such as a power MOSFET. As used herein, the gate, collector, and emitter terminals of an IGBT also refer to gate, drain, and source terminals of a MOSFET. A lower transistor 12 (with corresponding lower gate, collector, and emitter terminals) is connected in series with upper transistor 11 between a positive bus 13 and a ground bus 14 to define an intermediate junction 15. Anti-parallel diodes 16 and 17 are connected across transistors 11 and 12.

The upper gate circuit and the upper emitter terminal create an upper common source inductance comprised of a gate loop inductance 18 magnetically coupled to a power loop inductance 19. A gate drive circuit 20 and a gate resistor 21 are coupled to the gate terminal in order to control the switching of upper transistor 11. The lower gate circuit and the lower emitter terminal create a lower common source inductance comprised of a gate loop inductance 22 magnetically coupled to a power loop inductance 23. A gate drive circuit 24 and a gate resistor 25 are coupled to the gate terminal in order to control the switching of lower transistor 12. Gate drive circuits 20 and 24 generate gate drive signals according to PWM command signals from a PWM controller 26 as known in the art.

The magnetic coupling between a power loop and a gate loop can sometimes create undesirable interactions in which changes in the output current from a device causes changes in the gate signal which is attempting to control the device. Therefore, typical design rules used during development of transistor device packaging and circuits using such devices have generally aimed to minimize the common source inductance.

For a transistor in a phase leg, the influence of the magnitude of the common source inductance on the switching time and voltage overshoot can be beneficial. More specifically, the switching time can be favorably reduced while the size of the voltage overshoot or spike remains sufficiently small. The reduced switching time can lead to lower energy loss (i.e., increased efficiency).

The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance $L_{CSI}$. Examples are shown in co-pending, commonly assigned U.S. patent application Ser. No. 15/361,898 filed Nov. 28, 2016; U.S. patent application Ser. No. 15/366,266 filed Dec. 1, 2016; U.S. patent application Ser. No. 15/341,184 filed Nov. 2, 2016; and U.S. patent application Ser. No. 15/251,231 filed Aug. 30, 2016; each of which is incorporated herein by reference in its entirety.

Figure 2:
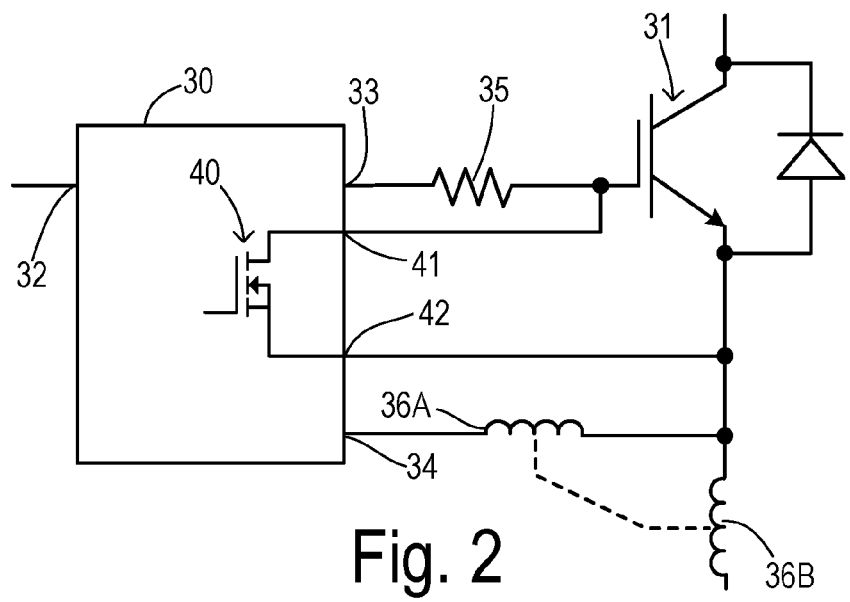
FIG. 2 is a schematic diagram showing a driver circuit with an active clamp bypassing an enhanced common source inductance.

Parasitic inductances (including common source inductance), electrical noise, or other stray voltages have the potential to cause false (i.e., inadvertent) activations of the phase leg switching transistors. To inhibit such activations, active clamping may be used as shown in FIG. 2. A gate drive circuit 30 is coupled to a phase leg switching transistor 31. Drive circuit 30 may be typically implemented in an integrated circuit package that accepts switching commands from a PWM controller at an input pin 32 and generates appropriate signal characteristics to drive the gate terminal of transistor 31 via an output pin 33 and a ground pin 34. Output pin 33 is coupled to a gate terminal of transistor 31 via a gate resistor 35. Ground pin 34 is coupled to an emitter terminal of transistor 31 via an inductance 36A. A power loop inductance 36B is magnetically coupled with inductance 36A in order to enhance the common source inductance. The emitter terminal used to establish the gate loop via inductance 36A may be a Kelvin emitter terminal (i.e., an emitter connection separate from the main output current of transistor 31) as known in the art.

Drive circuit 30 is adapted to provide an active clamping function using a clamping transistor 40 (typically implemented as a MOSFET which is turned on when transistor 31 is intended to be in an OFF state). Clamping transistor 40 has a drain terminal directly connected to the gate of transistor 31 via a pin 41, and has a source terminal directly connected to the emitter of transistor 31 via a pin 42. Preferably, pin 42 is connected to another Kelvin emitter terminal of transistor 31. The connections of clamping transistor 40 are configured to bypass gate resistor 35 and inductances 36A and 36B to reliably hold transistor 31 in the OFF state when desired.

In the configuration of FIG. 2, four integrated circuit pins are utilized for connecting the gate drive signal and the active clamp to the switching transistor. It would be desirable to reduce the number of pins required to reduce cost and to save space on a printed circuit board. In addition, since the source of the clamping transistor is connected to the emitter of the switching transistor, the gate of the clamping transistor is referenced to a potentially fluctuating voltage due to the presence of the common source inductance and other factors which could affect the performance of the clamping function.

Figure 3:
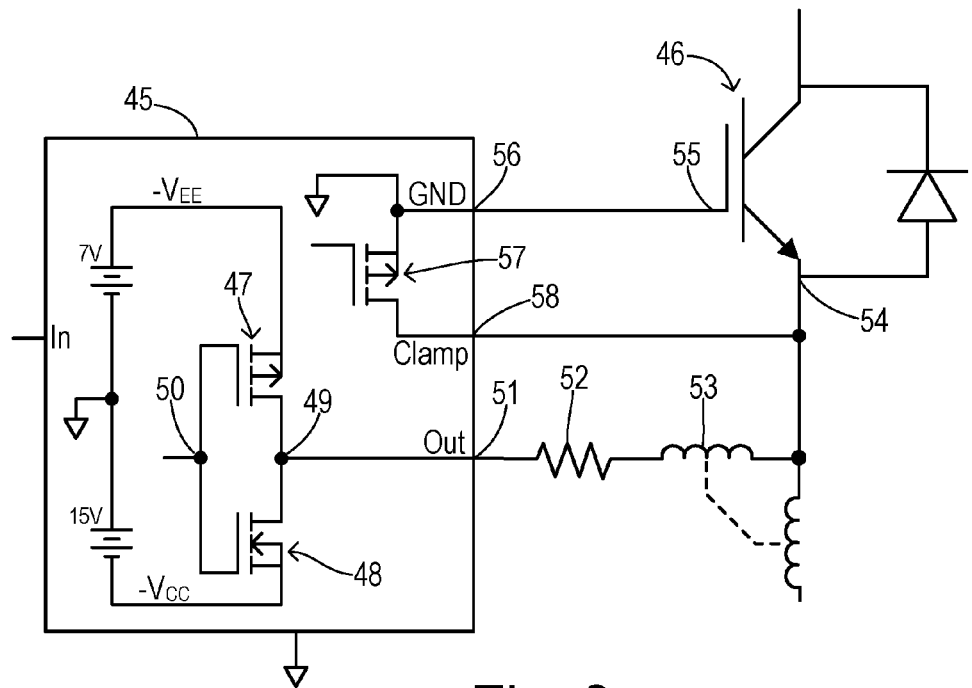
FIG. 3 is a schematic diagram showing a driver circuit in greater detail wherein the IGBT gate is referenced to ground, wherein the enhanced common source inductance is associated with the emitter terminal, and wherein an active clamp is comprised a P-channel MOSFET.

In a preferred embodiment shown in FIG. 3, one input/output pin of the driver circuit is eliminated by sharing a pin between the gate drive and clamping functions. In addition, the interconnection of the clamping transistor references the gate terminal of the clamping transistor to ground (i.e., the ground of the power supply for the gate drivers) which is inherently less subject to voltage fluctuations. Referring to FIG. 3, a gate drive integrated circuit 45 is provided for a phase leg switching transistor (e.g., IGBT) 46. To drive transistor 46 to its ON state or OFF state, a gate driver comprises a pair of complementary MOSFETs 47 and 48. MOSFETs 47 and 48 have their source terminals referenced to power supply voltages $-V_{CC}$ and $-V_{EE}$, respectively. MOSFET 47 is a p-channel device and MOSFET 48 is an n-channel device. MOSFET pair 47/48 has an output at an intermediate junction 49 and an input 50 connected to their gate terminals. Output junction 49 is connected via an OUT pin 51 to a Kelvin emitter terminal of transistor 46 through a gate resistor 52 and enhanced common source inductance 53. By moving gate resistance 52 to the emitter side of the driver circuit, gate terminal 55 of transistor 46 can have a single connection to gate drive IC 45 (i.e., a direct connection to ground via a GND pin 56 which is shared by the gate drive function and the clamping function). Activating MOSFET 48 turns on transistor 46, while activating MOSFET 47 turns off transistor 46. In once preferred example, a voltage of about 7V is used to generate power supply voltage $-V_{EE}$ and a voltage of about 15V is used to generate power supply voltage $-V_{CC}$.

For the active clamping function, a p-channel MOSFET 57 has its source terminal connected to gate terminal 55 (and to ground) and has its drain terminal connected to Kelvin emitter terminal 54 (or another separate Kelvin emitter terminal) so that the interconnection of clamp MOSFET 57 bypasses gate resistance 52 and enhanced common source inductance 53. The use of a p-channel device allows the source terminal to be connected to ground, thereby sharing pin 56 between the gate drive and clamping functions. Furthermore, by referencing the operation of clamping MOSFET 57 to ground, there is greater immunity to noise or voltage fluctuations and the active clamp can be reliably maintained (as opposed to conventional use of an n-channel MOSFET which references the gate to the source voltage).

Figure 4:
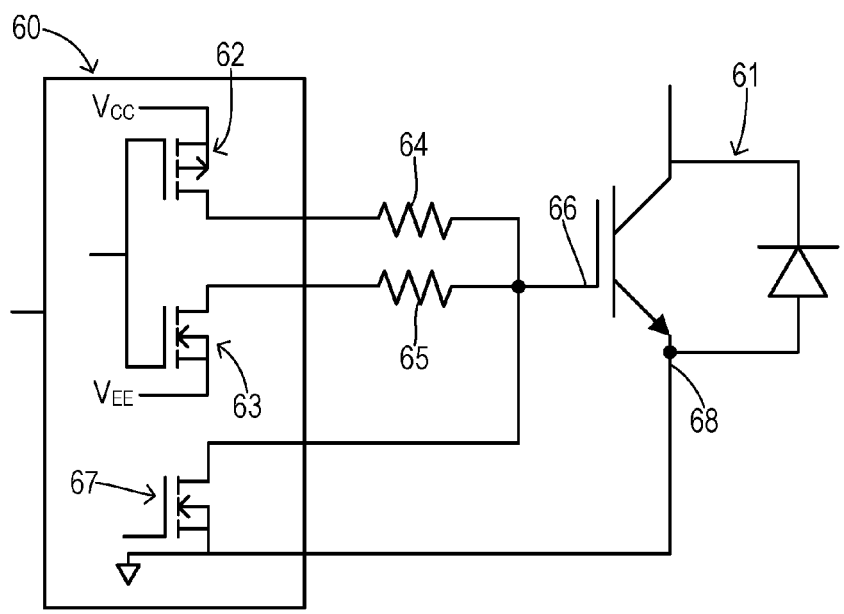
FIG. 4 is a schematic diagram showing a driver circuit with separate turn-on and turn-off resistance characteristics of an inverter IGBT.

In some embodiments of an electric drive system, it may be desirable to provide different switching characteristics when turning a phase leg transistor ON and OFF. For example, there may be advantages to having a turn-on time which is not the same as a turn-off time. Therefore, it is known to utilize different values of a gate resistance for turning on and turning off as shown in FIG. 4. A gate drive IC 60 is used to control a phase leg transistor 61. A gate driver has a complementary pair of MOSFETs 62 and 63, each connected to a gate terminal 66 of transistor 61 via a respective gate resistor 64 and 65. Charging of gate 66 during turn on and discharging of gate 66 during turn off occur through different values of resistance, thereby providing different time constants in the gate driver for turn on vs. turn off. FIG. 4 shows a conventional n-channel clamping MOSFET 67 connected between gate terminal 66 and an emitter terminal 68.

Figure 5:
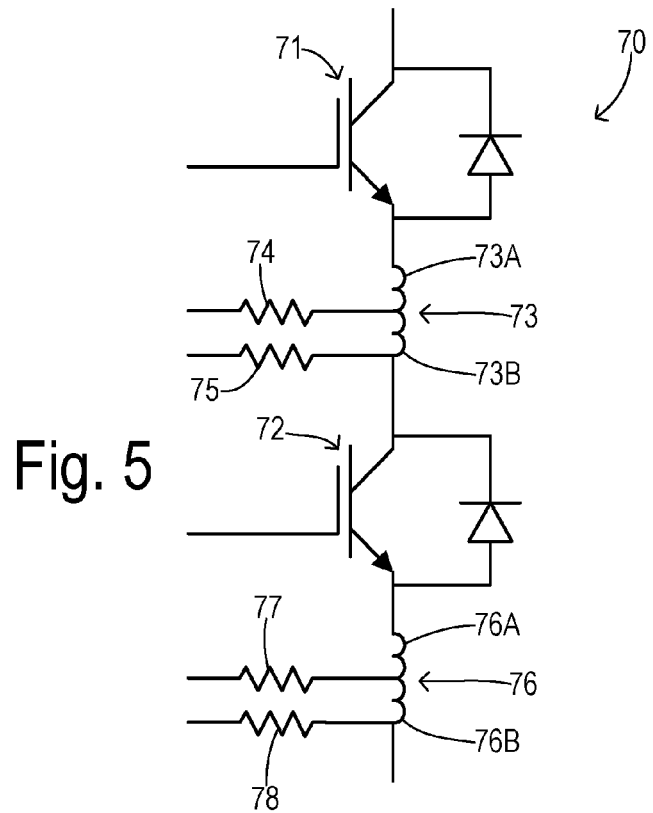
FIG. 5 is a schematic diagram showing enhancing common source inductance having separate values for IGBT turn-on and turn-off.

Besides having different turn-on and turn-off resistances, different values of an enhanced common source inductance may be desirable for the respective on/off operations. FIG. 5 shows a first embodiment for enhancing common source inductance in a phase leg 70 having transistors 71 and 72. On the emitter side of transistor 71, an enhanced $L_{CSI}$ 73 has a first portion 73A and a second portion 73B. A first gate resistor 74 is connected to an intermediate portion of enhanced $L_{CSI}$ 73 so that a corresponding turn-on or turn-off enhanced $L_{CSI}$ is less than an enhanced $L_{CSI}$ for the opposite turn-on or turn-off operation obtained with a second gate resistor 75. Thus, the respective turn-on and turn-off common source inductances for transistor 71 share partial inductance 73A and the resulting enhanced $L_{CSI}$ for turn-on and turn-off are unequal. Transistor 72 has the same configuration with enhanced $L_{CSI}$ 76 (with partial inductances 76A and 76B) and gate resistors 77 and 78.

Figure 6:
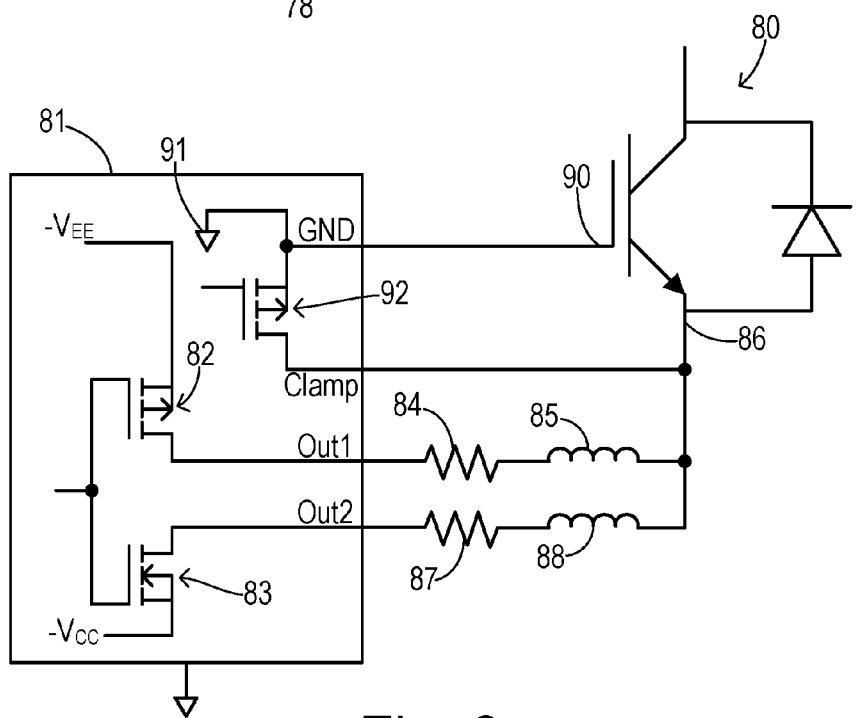
FIG. 6 is a schematic diagram showing a driver circuit in greater detail for use with separate enhanced common source inductance for IGBT turn-on and turn-off.

FIG. 6 shows a gate driver IC in greater detail and shows an alternative embodiment wherein an enhanced $L_{CSI}$ has independent inductances for turn on and turn off. Thus, a phase leg transistor 80 is controlled via a gate driver IC 81 containing a gate drive complementary pair of MOSFETs 82 and 83. Turn-off MOSFET 82 is connected to a first output pin OUT1. A Kelvin emitter terminal 86 of transistor 80 is connected to pin OUT1 via a gate resistor 84 and enhanced common source inductance 85. Turn-on MOSFET 83 is connected to a second output pin OUT2. Kelvin emitter terminal 86 is connected to pin OUT2 via a gate resistor 87 and enhanced common source inductance 88. The active clamping function is similar to that of the previous embodiment. A gate terminal 90 of transistor 80 is connected to a ground pin GND of gate driver IC 81. The ground pin is connected to ground at 91 and to a source terminal of a p-channel clamping MOSFET 92. A drain terminal of MOSFET 92 is connected to a CLAMP pin which is directly connected to Kelvin emitter terminal 86 bypassing the gate resistances and common source inductances. Thus, independently controlled turn-on and turn-off characteristics are obtained, while the gates of both the active clamping switch and the phase leg switch are referenced to ground. Therefore, increased reliability is obtained for the active clamping function while simultaneously saving cost and space for an associated driver circuit. Other types of semiconductor switching devices can also be used, and the invention can also utilize discrete components for the driver/clamping circuits.

What is claimed is:

1. An inverter comprising;
   a phase leg having series-connected upper and lower transistors adapted to be connected between a positive bus and a ground bus; and
   upper and lower gate drive circuits supplying gate drive signals to the upper and lower transistors, respectively, and each including an active clamp for deactivating the upper and lower transistors, respectively;
   wherein the transistors are comprised of semiconductor devices, each having respective gate, collector, and emitter terminals;
   wherein each pair of gate and emitter terminals is adapted to provide an enhanced common source inductance therebetween; and
   wherein each gate terminal is adapted to be tied to a ground voltage of the drive circuits.

2. The inverter of claim 1 wherein each respective active clamp is comprised of a p-channel MOSFET having a source terminal connected to the gate terminal of a respective transistor and having a drain terminal connected to the emitter terminal of the respective transistor bypassing the respective enhanced common source inductance.

3. The inverter of claim 2 wherein the gate drive signals comprise a negative signal voltage with respect to the ground which is selectably applied to a respective emitter terminal without bypassing the respective enhanced common source inductance.

4. The inverter of claim 3 wherein the gate drive circuits each comprise a pair of complementary MOSFETs, each complementary MOSFET coupling a respective gate signal to a respective emitter terminal.

5. The inverter of claim 4 wherein each respective enhanced common source inductance includes a respective turn-on common source inductance and a respective turn-off common source inductance, wherein the respective turn-on and turn-off common source inductances are each connected to a respective one of the complementary MOSFETs.

6. The inverter of claim 5 wherein the respective turn-on and turn-off common source inductances are unequal.

7. The inverter of claim 5 wherein the respective turn-on and turn-off common source inductances share a partial inductance.

8. The inverter of claim 2 wherein the emitters terminals connected to the respective active clamps are comprised of Kelvin emitter terminals.

9. An electric drive for a vehicle driven by a traction motor, comprising:
   a DC link with positive and ground buses configured to receive a DC supply voltage;
   a plurality of phase legs in a bridge configuration coupled between the positive and ground buses, each phase leg having series-connected upper and lower transistors with an intermediate junction providing a phase leg output; and
   upper and lower gate drive circuits for each phase leg supplying gate drive signals to the upper and lower transistors, respectively, wherein each drive circuit includes an active clamp for deactivating the upper and lower transistors, respectively;

wherein the transistors are comprised of semiconductor devices and each having respective gate, collector, and emitter terminals;

wherein each pair of gate and emitter terminals is adapted to provide an enhanced common source inductance therebetween;

wherein each gate terminal is adapted to be tied to a ground voltage of the drive circuits; and wherein each respective active clamp is comprised of a p-channel MOSFET having a source terminal connected to the gate terminal of a respective transistor and having a drain terminal connected to the emitter terminal of the respective transistor bypassing the respective enhanced common source inductance.

10. The electric drive of claim 9 wherein the gate drive signals comprise a negative signal voltage with respect to the ground voltage which is selectably applied to a respective emitter terminal without bypassing the respective enhanced common source inductance.

11. The electric drive of claim 10 wherein the gate drive circuits each comprise a pair of complementary MOSFETs, each complementary MOSFET coupling a respective gate signal to a respective emitter terminal.

12. The electric drive of claim 11 wherein each respective enhanced common source inductance includes a respective turn-on common source inductance and a respective turn-off common source inductance, wherein the respective turn-on and turn-off common source inductances are each connected to a respective one of the complementary MOSFETs.

13. The electric drive of claim 12 wherein the respective turn-on and turn-off common source inductances are unequal.

14. The electric drive of claim 12 wherein the respective turn-on and turn-off common source inductances share a partial inductance.

15. A gate driver for an inverter phase transistor, comprising;

a gate signal generator coupling a transistor gate to ground and selectably coupling a transistor emitter to a negative voltage, wherein a gate signal flows through an enhanced common source inductance associated with the emitter; and an active clamp comprised of a p-channel MOSFET having a source connected to the gate and having a drain connected to the emitter bypassing the enhanced common source inductance.

16. The gate driver of claim 15 wherein the gate signal generator comprises a pair of complementary MOSFETs, each complementary MOSFET coupling a respective portion of the gate signal to the emitter.

17. The gate driver of claim 16 wherein the enhanced common source inductance includes a turn-on common source inductance and a turn-off common source inductance, wherein the turn-on and turn-off common source inductances are each connected to a respective one of the complementary MOSFETs.

18. The gate driver of claim 17 wherein the respective turn-on and turn-off common source inductances are unequal.

19. The gate driver of claim 17 wherein the respective turn-on and turn-off common source inductances share a partial inductance.

20. The gate driver of claim 15 wherein the emitter is comprised of a Kelvin emitter.

* * * * *